United States Patent
Haneda et al.

(10) Patent No.: US 7,023,891 B2
(45) Date of Patent: Apr. 4, 2006

(54) SEMICONDUCTOR OPTICAL DEVICE

(75) Inventors: Hideki Haneda, Tokyo (JP); Go Sakaino, Tokyo (JP); Yoshihiro Hisa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 269 days.

(21) Appl. No.: 10/427,956

(22) Filed: May 2, 2003

(65) Prior Publication Data

US 2003/0210721 A1 Nov. 13, 2003

(30) Foreign Application Priority Data

May 8, 2002 (JP) .............................. 2002-132336

(51) Int. Cl.
 *H01S 5/20* (2006.01)
(52) U.S. Cl. ................................. 372/45.01; 372/46.01
(58) Field of Classification Search ............... 372/45, 372/46
See application file for complete search history.

(56) References Cited

U.S. PATENT DOCUMENTS

| | | | |
|---|---|---|---|
| 4,835,783 A | | 5/1989 | Suyama et al. |
| 5,222,091 A | | 6/1993 | Holmstrom et al. |
| 5,351,258 A | * | 9/1994 | Okumura et al. ............. 372/46 |
| 5,399,885 A | | 3/1995 | Thijs et al. |
| 5,917,847 A | * | 6/1999 | Sun ............................... 372/50 |
| 5,978,400 A | * | 11/1999 | Campbell et al. ............. 372/46 |
| 6,075,799 A | * | 6/2000 | Uchida et al. ................ 372/27 |
| 6,075,800 A | | 6/2000 | Spear |
| 6,134,368 A | | 10/2000 | Sakata |
| 6,396,854 B1 | | 5/2002 | Takagi |
| 6,411,642 B1 | * | 6/2002 | Mazed ........................ 372/103 |
| 2001/0026567 A1 | * | 10/2001 | Kaneko et al. ................ 372/43 |

FOREIGN PATENT DOCUMENTS

| | | |
|---|---|---|
| EP | 547281 | 6/1993 |
| JP | 11-251679 | 9/1999 |
| JP | 2001-189530 | 7/2001 |

* cited by examiner

*Primary Examiner*—Minsun Oh Harvey
*Assistant Examiner*—Tod T. Van Roy
(74) *Attorney, Agent, or Firm*—Leydig, Voit & Mayer, Ltd.

(57) ABSTRACT

A semiconductor optical device which has a ridge structure includes a waveguide area between paired mesa trenches; first and second mount areas disposed outside the mesa trenches; a first spacer layer disposed in a first mount area and a second spacer layer disposed in a second mount area; a first metal layer electrically connected to an upper cladding layer in the waveguide area and extending from the waveguide area over the first mount area; and a second metal layer disposed over the second mount area. Thicknesses from a back surface of the semiconductor optical device to the first metal layer in the first mount area and to the second metal layer in the second mount area are both larger than thickness from the back surface to the first metal layer in the waveguide area.

4 Claims, 5 Drawing Sheets

SEMICONDUCTOR OPTICAL DEVICE

CROSS-REFERENCE TO RELATED APPLICATIONS

A related patent application is commonly assigned Japanese Patent Application No. 2003-132336 filed on May 8, 2002, which is incorporated by reference into the present patent application.

BACKGROUND OF THE INVENTION

1. Field of the Invention

The present invention relates to a semiconductor optical device, and more particularly, to a semiconductor optical device having a structure which prevents damage to a waveguide area which has a ridge structure.

2. Description of the Related Art

FIGS. 5A and 5B show a conventional semiconductor laser generally denoted at 500. FIG. 5A shows a top view of the laser 500 and FIG. 5B shows a cross sectional view of the laser 500 taken along a direction V—V of FIG. 5B.

The semiconductor laser 500 comprises a semiconductor substrate 1 having a front surface and a back surface. A buffer layer 2 is disposed on a surface of the semiconductor substrate 1. The buffer layer 2 has a stripe-shaped structure which protrudes upward in the form of stripes, and an active layer 3 is disposed on the buffer layer 2. A current blocking layer 4 buries both sides to the active layer 3, and a contact layer 5 is disposed on the current blocking layer 4.

Mesa trenches 6 extending to the semiconductor substrate 1 are disposed on both sides to the buffer layer 2 which has the stripe-shaped structure, thereby defining a waveguide area 20 sandwiched by the mesa trenches 6 and mount areas 21 and 22 which are located on both sides of the waveguide area 20.

A protection film 8 is disposed on the contact layer 5 and a surface of the semiconductor substrate 1 which contains the insides of the mesa trenches 6, and a metal plate layer 10 is disposed on the protection film 8. The metal plate layer 10 is connected with the contact layer 5 through an opening 9 which is formed in the protection film 8 within the waveguide area 20. Further, a metal plate layer 12 is disposed to the back surface of the semiconductor substrate 1.

In the semiconductor laser 500, the top edge of the waveguide area 20, namely, the top surface of the metal plate layer 10 is higher than the top edge of the mount area 22, namely, a surface of the protection film 8. Hence, the waveguide area 20 is subjected to a stress at a manufacturing step and/or a mounting step, and fractures or is damaged, thus inviting a problem that the production yield deteriorates. To be more specific, the waveguide area 20 is damaged at a step of vacuum-sucking the semiconductor laser 500 on the front surface of the semiconductor laser 500 and thereby holding the semiconductor laser 500 and mounting the semiconductor laser 500 to a package, at a step of coating edge surfaces with a plurality of semiconductor lasers 500 stacked one atop the other, or at other steps.

SUMMARY OF THE INVENTION

Accordingly, the present invention aims at providing a semiconductor optical device having a structure which prevents damage to a waveguide area at a manufacturing step, and/or a mounting step.

The present invention is directed to a ridge waveguide semiconductor optical device. The device comprises a semiconductor substrate having a front surface and a back surface; a lower cladding layer, an active layer and an upper cladding layer which are stacked one atop the other on a surface of the semiconductor substrate; a waveguide area which is disposed between paired mesa trenches which are provided approximately parallel to each other by graving at least the upper cladding layer; a first mount area and a second mount area which are respectively disposed outside the paired mesa trenches; a first spacer layer disposed on the upper cladding layer in the first mount area and a second spacer layer disposed on the upper cladding layer in the second mount area; a first metal layer which is electrically connected to the upper cladding layer in the waveguide area and which expands from above the waveguide area over the first mount area; and a second metal layer which is disposed over the second mount area. The height from the back surface of the semiconductor substrate to the top edge of the first metal layer in the first mount area and the height from the back surface of the semiconductor substrate to the top edge of the second metal layer in the second mount area are both higher than the height from the back surface of the semiconductor substrate to the top edge of the first metal layer in the waveguide area.

DETAILED DESCRIPTION OF THE PREFERRED EMBODIMENTS

Figure 1:
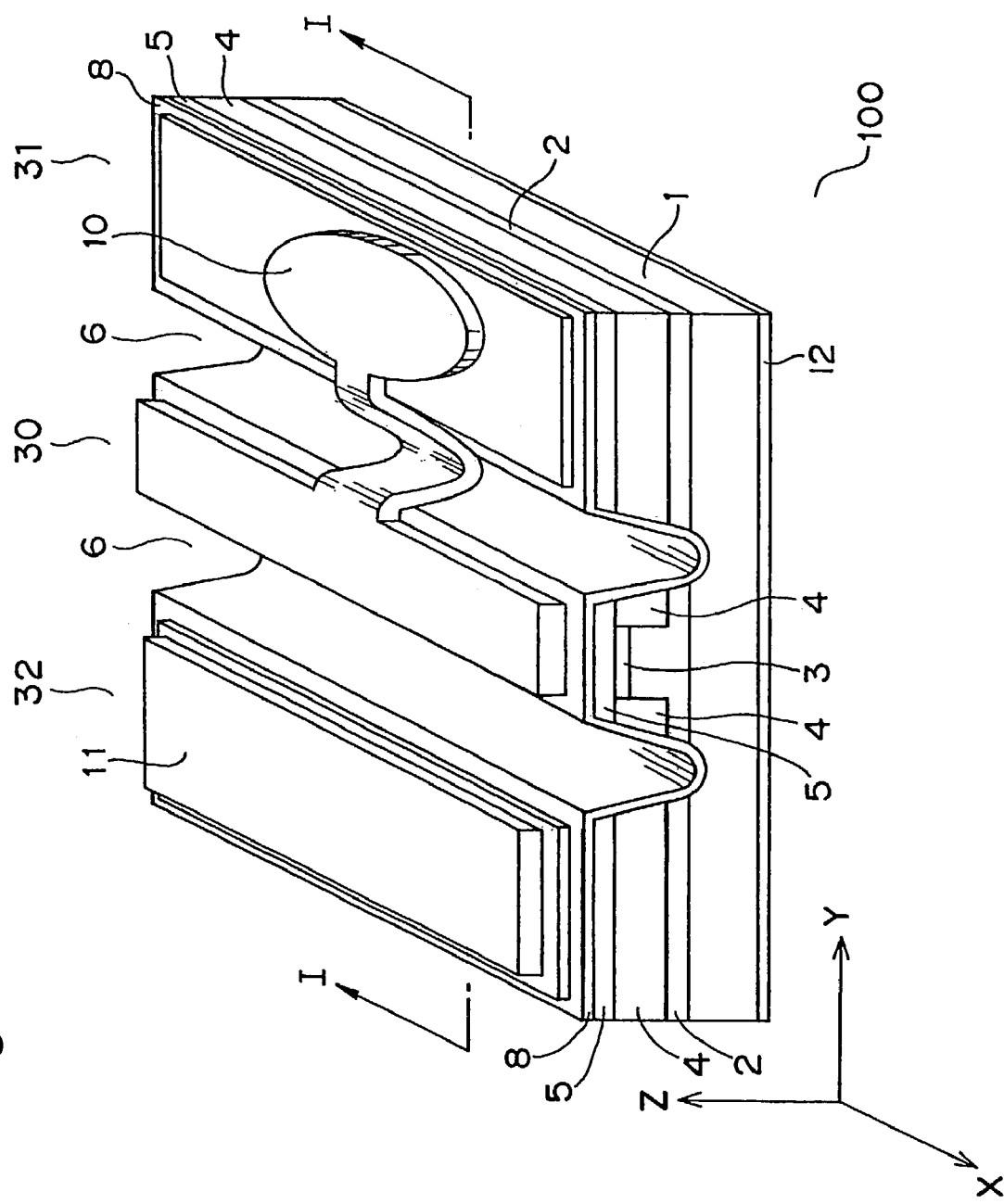
FIG. 1 is a perspective view of the semiconductor laser according to the preferred embodiment of the present invention.
Figure 5A:
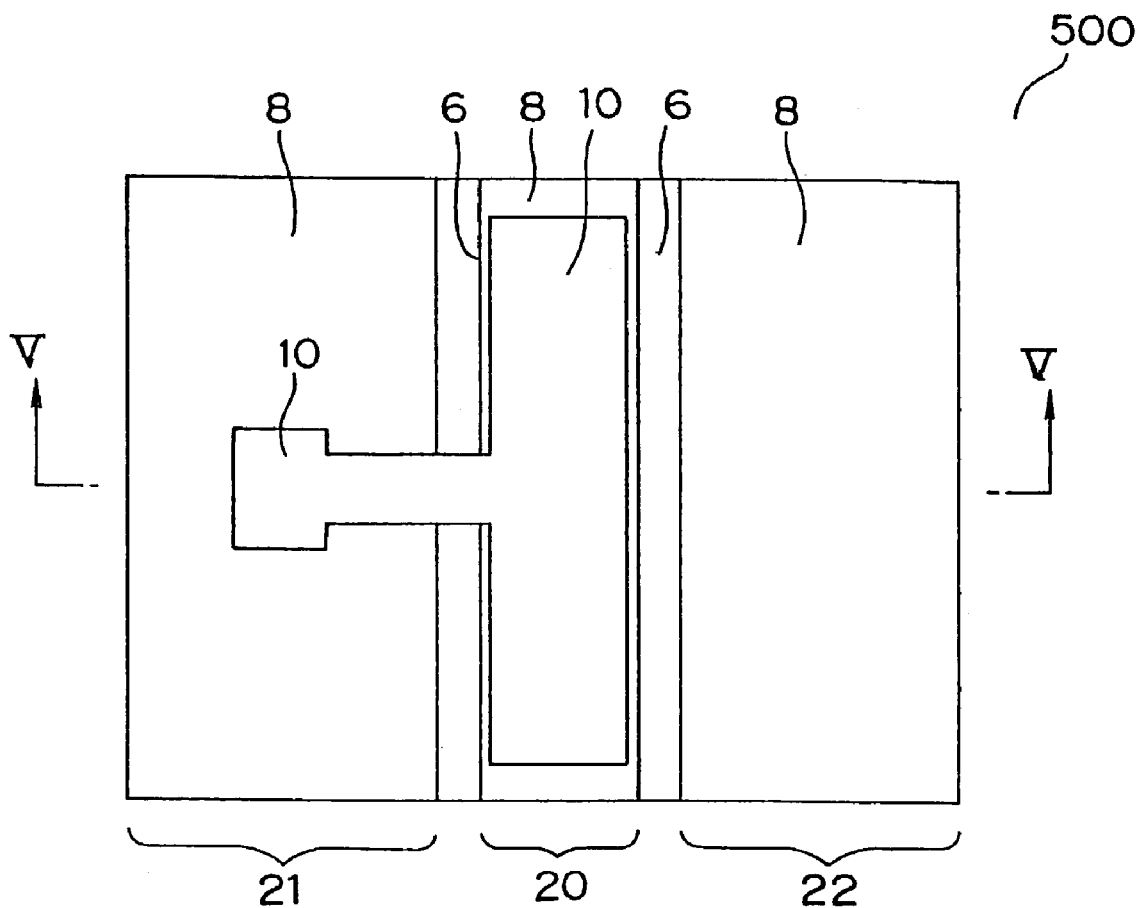
FIGS. 5A and 5B are a top view and a cross sectional view of the conventional semiconductor laser.
Figure 5B:
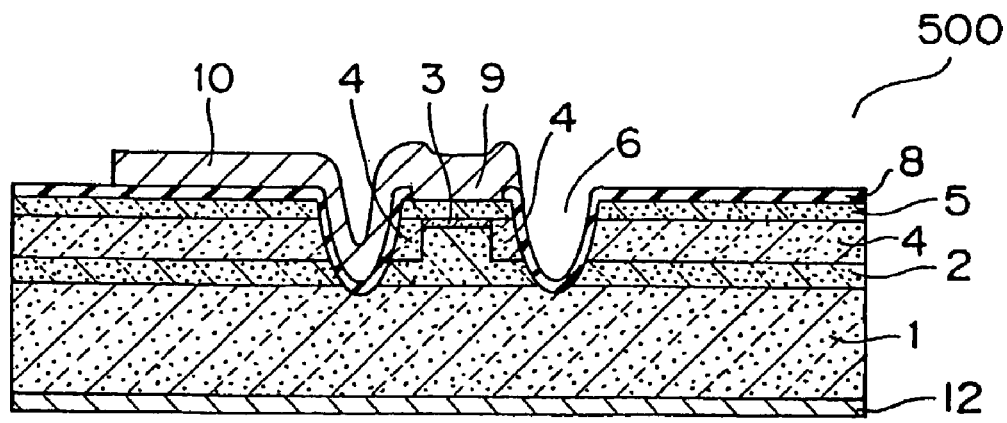

FIG. 1 is a perspective view of a semiconductor laser according to a preferred embodiment generally denoted at 100. In FIG. 1, the same numerals as those used in FIGS. 5A and 5B denote the same or corresponding portions.

The semiconductor laser 100 comprises an InP semiconductor substrate 1 of the p-type having a front surface and a back surface. A p-type InP buffer layer 2 is disposed on a surface of the semiconductor substrate 1. The buffer layer 2 comprises a stripe-shaped convex portion which protrudes away from the substrate 1, and an active layer 3 is disposed on the buffer layer 2. The active layer 3 has a multiple quantum well (MQW) structure which includes an InGaAsP well layer and an InGaAsP barrier layer. A current blocking layer 4, which has a stacked structure (not shown) of a p-type InP layer and an n-type InP layer buries both sides (the right-hand side and the left-hand side) of the active layer 3. Further, an n-type InP contact layer 5 is disposed on the current blocking layer 4. The buffer layer 2 and the contact layer 5 function as a lower cladding layer and an upper cladding layer with respect to the active layer 3.

Paired mesa trenches 6 extending to the semiconductor substrate 1 and approximately parallel to each other are disposed on both sides to the stripe-shaped convex portion and along the convex portion. The area sandwiched by the paired mesa trenches 6 (inner area) becomes a waveguide area 30 whose width (the length in the direction of the y-axis) is about 6 μm, for instance. Meanwhile, areas outside the mesa trenches 6 (outer areas) become a first mount area 31 and a second mount area 32.

Figure 2A:
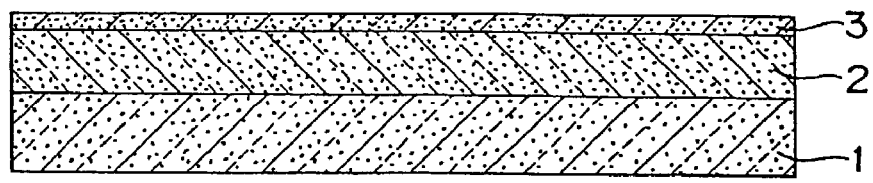
FIGS. 2A–2I are a cross sectional view showing steps of manufacturing the semiconductor laser according to the preferred embodiment of the present invention.
Figure 2B:
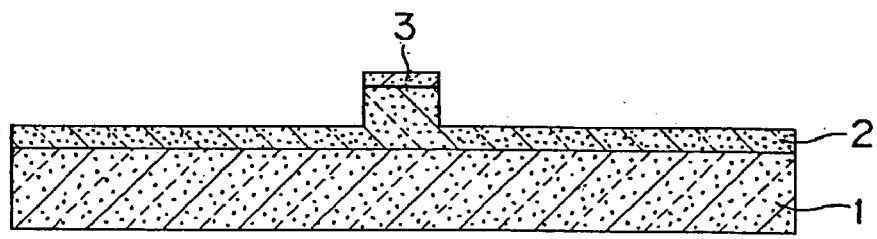
Figure 2C:
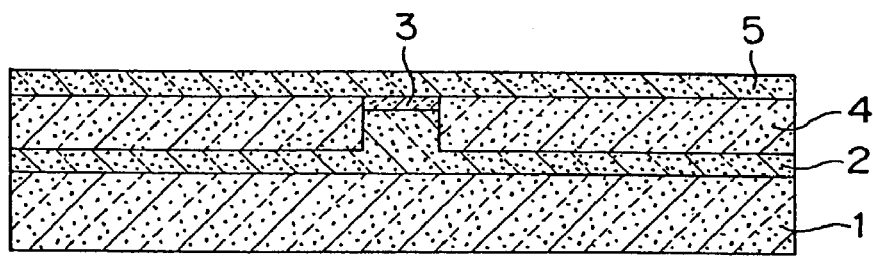
Figure 2D:
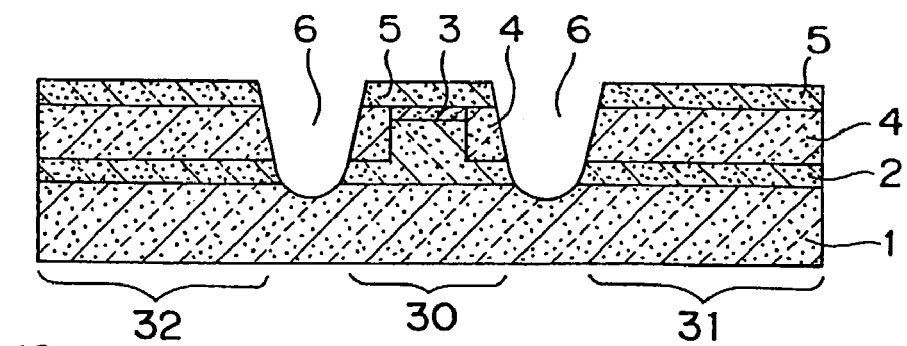
Figure 2E:
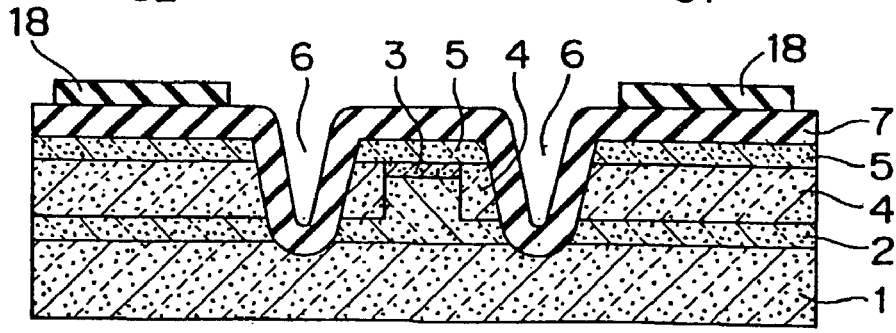
Figure 2F:
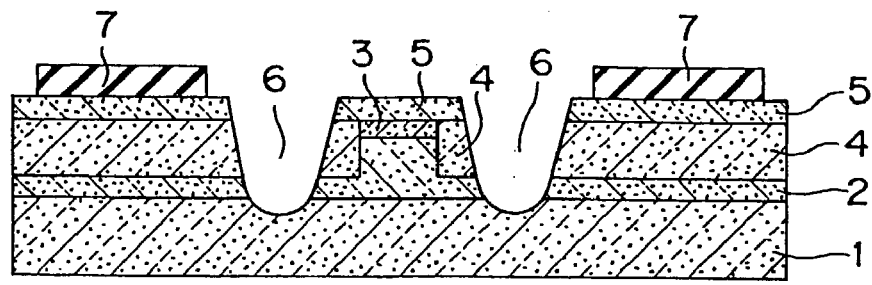
Figure 2G:
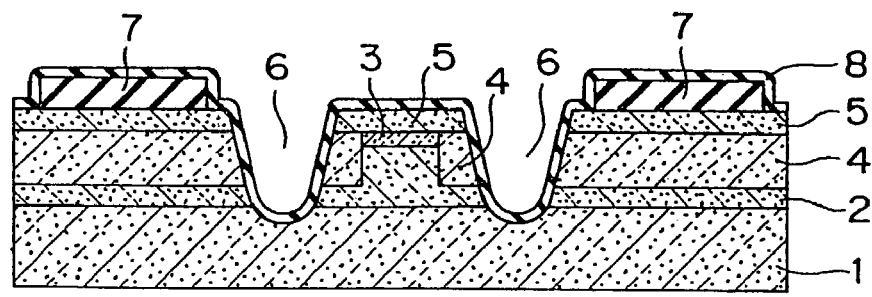
Figure 2H:
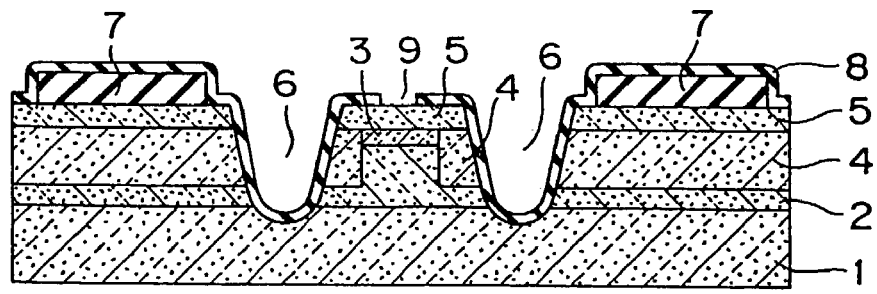
Figure 2I:
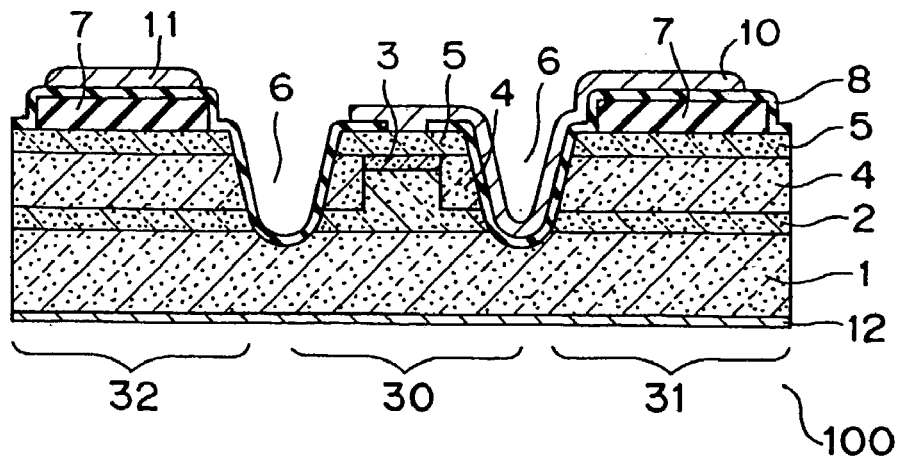

A spacer layer 7, shown in FIG. 2I, is disposed on the contact layer 5 in the first mount area 31 and the second mount area 32. The spacer layer 7 is made of silicon oxide, polyimide, or the like, for instance, and the thickness of the spacer layer 7 is about 0.4 μm.

A protection film 8 of silicon oxide, for example, is disposed on the contact layer 5, the spacer layer 7, and the surface of the semiconductor substrate 1 which contains the mesa trenches 6.

A metal plate layer 10 is disposed on the protection film 8. The metal plate layer 10 is connected with the contact layer 5 through an opening 9, shown in FIG. 2H, in the protection film 8 within the waveguide area 30. Further, the metal plate layer 10 extends even over the first mount area 31 beyond the mesa trench 6, thereby forming a surface electrode on the first mount area 31. Meanwhile, a metal plate layer 11 which does not form an electrode is disposed on the second mount area 32. The metal plate layers 10 and 11 are made of gold for instance, and the film thickness of the metal plate layers 10 and 11 is about 4 μm.

In addition, a metal plate layer 12 of gold for instance is disposed also on the back surface of the semiconductor substrate 1. The metal plate layer 12 forms a surface electrode.

The metal plate layer 11 may have a structure in which the metal plate layer 11 is electrically connected to the contact layer 5 through an opening, like the metal plate layer 10.

In the semiconductor laser 100, since there is the spacer layer 7 disposed on the first mount area 31 and the second mount area 32, the height from the back surface of the semiconductor substrate 1 to the top edge of the metal plate layer 10 in the first mount area 31 and the height from the back surface of the semiconductor substrate 1 to the top edge of the metal plate layer 11 in the second mount area 32 are both higher than the height from the back surface of the semiconductor substrate 1 to the top edge of the metal plate layer 10 in the waveguide area 30.

Hence, the metal plate layers 10 and 11 in the first mount areas 31 and 32 protect a metal plate layer 30 located in the waveguide area 30 and fracture of or damage to the waveguide area 30 is prevented at a manufacturing step and/or a mounting step.

A chip width Wc (the length in the direction of the y-axis) of the semiconductor laser 100 is about 300 μm, a cavity length Lc (the length in the direction of an x-axis) of the semiconductor laser 100 is about 200 μm, and a chip thickness Tc (the height in the direction of a z-axis) of the semiconductor laser 100 is about 100 μm. Although a semiconductor layer on an emission end surface is exposed in FIG. 1, the emission end surface may be coated with an anti-reflection film.

A method of manufacturing the semiconductor laser 100 will now be described with reference to FIGS. 2A–2I. The manufacturing method comprises steps 1 through 9 described below.

Step 1: As shown in FIG. 2A, the p-type semiconductor substrate 1 of InP which has a front surface and a back surface is prepared. Following this, the p-type buffer layer 2 of InP and the active layer 3 having the multiple quantum well (MQW) structure which includes the InGaAsP well layer and the InGaAsP barrier layer are formed on the surface of the semiconductor substrate 1 by a CVD method for instance. Although the active layer 3 has the multiple quantum well structure in this method, the active layer 3 may have a single quantum well (SQW) structure.

Step 2: As shown in FIG. 2B, using a resist mask (not shown), the active layer 3 and the buffer layer 2 are partially etched, thereby forming the convex portion which protrudes in the shape of a stripe.

Step 3: As shown in FIG. 2C, using a selective growth process for instance, the block layer 4 is formed to fill up the convex portion. The block layer 4 is formed by a stacked structure (not shown) of an InP layer of the p-type and an InP layer of the n-type for instance. A top edge surface of the block layer 4 is approximately at the same height as a top edge surface of the active layer 3. By a CVD method for instance, the InP contact layer 5 of the n-type is then formed on the block layer 4.

Step 4: As shown in FIG. 2D, the both sides on the stripe-shaped convex portion are etched down to the semiconductor substrate 1, thereby forming the paired mesa trenches 6. The mesa trenches 6 are formed so as to sandwich the stripe-shaped convex portion and so as to be approximately parallel to each other and along the convex portion. The depth of the mesa trenches 6 is about 7 μm, for example.

The area sandwiched between the paired mesa trenches 6 (inner area) becomes the waveguide area 30, and the width of the waveguide area 30 is about 6 μm for instance. Meanwhile, the areas outside the mesa trenches 6 (outer areas) become the first mount area 31 and the second mount area 32.

The active layer 3 in the waveguide area 30 is sandwiched by the buffer layer 2 and the contact layer 5 in the vertical direction, and located on the both sides to the active layer 3 is the block layer 4.

Step 5: As shown in FIG. 2E, by a CVD method for instance, the spacer layer 7 of silicon oxide is formed so as to cover the top surface. Following this, a resist mask 18 is formed on the first mount area 31 and the second mount area 32.

Step 6: As shown in FIG. 2F, using the resist mask 18, the spacer layer 7 is etched so as to leave the spacer layer 7 on the first mount area 31 and the second mount area 32. The thickness of the spacer layer 7 left on the first mount area 31 and the second mount area 32 is about 0.4 μm.

Although silicon oxide is used as the material of the spacer layer 7 in this method, polyimide may be used instead.

Step 7: As shown in FIG. 2G, by a CVD method for instance, the protection film 8 is formed so as to cover the entire surface. The protection film 8 is of silicon oxide for instance.

Step 8: As shown in FIG. 2H, through etching using a resist mask (not shown) for example, the opening 9 is formed in the protection film 8 on the waveguide area 30.

Step 9: As shown in FIG. 2I, by a plating method, the metal plate layers 10, 11 and 12 of gold for instance are formed. A Ti/Au layer may be formed as a bed for the metal plate layers 10 and 11. Further, an AuZn/Ti/Au layer may be formed as a bed for the metal plate layer 12.

The semiconductor laser 100 shown in FIG. 1 is completed through the steps described above.

Figure 3:
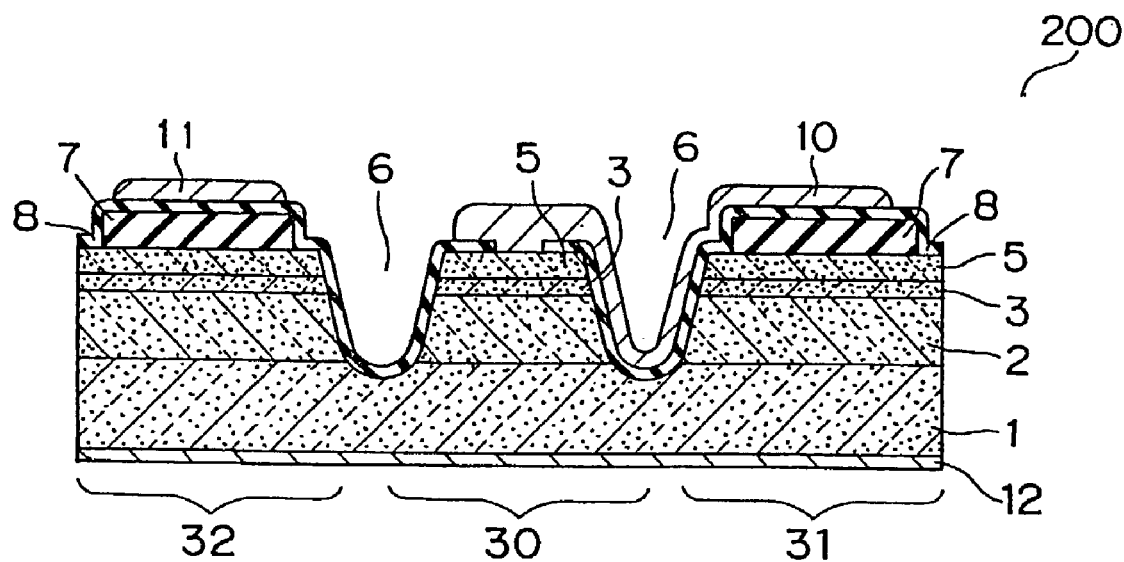
FIG. 3 is a perspective view of another semiconductor laser according to the preferred embodiment of the present invention.

FIG. 3 is a cross sectional view of another semiconductor laser according to the preferred embodiment generally denoted at 200. In FIG. 3, the same numerals as those used in FIGS. 1 and 2I denote the same or corresponding portions.

The semiconductor laser 200 has a structure without the current blocking layer 4 of the semiconductor laser 100 and containment in the transverse direction is realized by the mesa trenches 6. The structure according to the preferred embodiment is applicable to the semiconductor laser 200 having such a structure.

Figure 4:
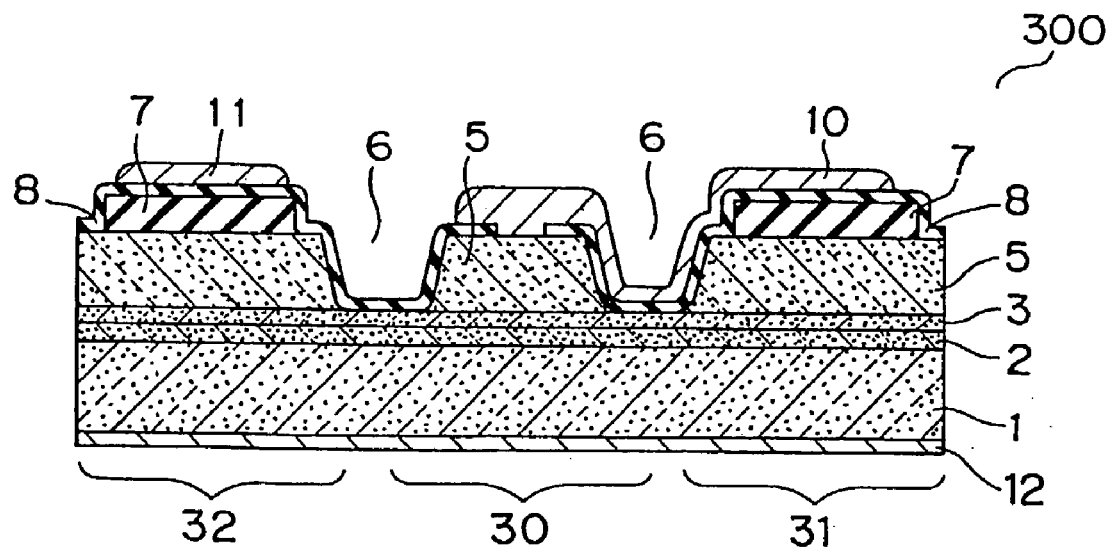
FIG. 4 is a perspective view of other semiconductor laser according to the preferred embodiment of the present invention.

FIG. 4 is a cross sectional view of another semiconductor laser according to a preferred embodiment generally denoted at 300. In FIG. 4, the same numerals as those used in FIG. 1 denote the same or corresponding portions.

The semiconductor laser 300 lacks the current blocking layer 4 of the semiconductor laser 100 and the stripe-shaped convex portion is formed by the contact layer 5. The structure according to the preferred embodiment is applicable to the semiconductor laser 300 having such a structure.

Although mesa trenches 3 expose the active layer 3 in FIG. 4, in an alternative, the groove extends only halfway through the contact layer 5.

While the foregoing has described the preferred embodiment in relation to a semiconductor laser in which InP is used as the semiconductor substrate 1, the structure according to the preferred embodiment is applicable to a semiconductor laser in which a material such as GaAs and GaN is used as the semiconductor substrate 1.

Further, this structure is applicable to a semiconductor optical device, such as a light emitting diode, a light receiving element and a light modulation element, which has the same or a similar structure.

As clearly described above, with the semiconductor optical device according to the present invention, it is possible to prevent damage to a waveguide area at steps of manufacturing and assembling and improve the production yield of manufacturing the semiconductor optical devices.

What is claimed is:

1. A ridge waveguide semiconductor optical device, comprising:
    a semiconductor substrate having a front surface and a back surface;
    a lower cladding layer disposed on said front surface of said semiconductor substrate and which comprises a stripe-shaped convex portion;
    an active layer disposed on said convex portion of said lower cladding layer;
    a current blocking layer burying both sides of said convex portion of said lower cladding layer and having a top surface approximately co-planar with a the top surface of said active layer;
    an upper cladding layer disposed on said active layer and said current blocking layer;
    a waveguide area disposed between paired mesa trenches which extend from a surface of said upper cladding layer to said semiconductor substrate, which are approximately parallel to each other and which sandwich said convex portion of said lower cladding layer;
    a first mount area and a second mount area disposed outside said paired mesa trenches;
    a first spacer layer disposed on said upper cladding layer in said first mount area and a second spacer layer disposed on said upper cladding layer in said second mount area;
    a first metal layer electrically connected to said upper cladding layer in said waveguide area and extending from above said waveguide area to over said first mount area; and
    a second metal layer disposed over said second mount area, wherein height from the back surface of said semiconductor substrate to a top edge of said first metal layer in said first mount area and height from the back surface of said semiconductor substrate to a top edge of said second metal layer in said second mount area are both larger than height from the back surface of said semiconductor substrate to a top edge of said first metal layer in said waveguide area.

2. The semiconductor optical device according to claim 1, wherein the top surface of said first metal layer in said first mount area and the top surface of said second metal layer in said second mount area are approximately co-planar.

3. The semiconductor optical device according to claim 1, wherein said first spacer layer and said second spacer layer are a material selected from the group consisting of silicon oxides and polyimide.

4. The semiconductor optical device according to claim 1, wherein thickness of said first metal layer in said first mount area and thickness of said second metal layer in said second mount area are approximately the same.

* * * * *